(12) United States Patent
Tsai (10) Patent No.: US 7,278,864 B2
(45) Date of Patent: Oct. 9, 2007

(54) ELECTRICAL CONNECTOR WITH A SOLDER BALL LOCKING STRUCTURE

(76) Inventor: Chou Hsuan Tsai, 15F,No. 4, Lane 127, Sec. 1, Fu-Hsing Rd., Hsin-Chuang City, Taipei Hsien (TW)

( * ) Notice: Subject to any disclaimer, the term of this patent is extended or adjusted under 35 U.S.C. 154(b) by 110 days.

(21) Appl. No.: 11/003,993

(22) Filed: Dec. 2, 2004

(65) Prior Publication Data

US 2006/0030180 A1 Feb. 9, 2006

(51) Int. Cl.
*H01R 12/00* (2006.01)
(52) U.S. Cl. ....................................................... 439/83
(58) Field of Classification Search ................... 439/83, 439/875, 876, 78
See application file for complete search history.

(56) References Cited

U.S. PATENT DOCUMENTS 6,533,590 B1 *  3/2003  Lee et al. ..................... 439/83
6,558,170 B1 *  5/2003  Lemke ......................... 439/83
6,679,709 B2 *  1/2004  Takeuchi ..................... 439/83
6,755,667 B2 *  6/2004  Lin .............................. 439/83
2003/0114028 A1 *  6/2003  Ohkita et al. ................. 439/83

\* cited by examiner

*Primary Examiner*—Phuong Dinh
(74) *Attorney, Agent, or Firm*—Pro-Techter Int'l Services (57) ABSTRACT

An electrical connector with a solder ball locking structure includes a base, solder balls and terminals. The base has terminal slots, solder ball slots under the terminal slots, and channels respectively communicating the terminal slots with the solder ball slots. The solder balls are respectively disposed in the solder ball slots. Each ball has a bottom end projecting over a bottom of the base. The terminals are respectively disposed in the terminal slots. Each terminal has a contact extending toward a top of the terminal slot and at least one connecting sheet extending toward a bottom of the terminal slot. The connecting sheet extends to the solder ball slot through the channel and intrudes into the solder ball to form a locking structure, which prevents the solder ball from falling out of the solder ball slot.

10 Claims, 11 Drawing Sheets

ELECTRICAL CONNECTOR WITH A SOLDER BALL LOCKING STRUCTURE

BACKGROUND OF THE INVENTION

1. Field of the Invention

The invention relates in general to an electrical connector, and more particularly to an electrical connector with a solder ball locking structure and a method for manufacturing the same.

2. Description of the Related Art

Figure 1:
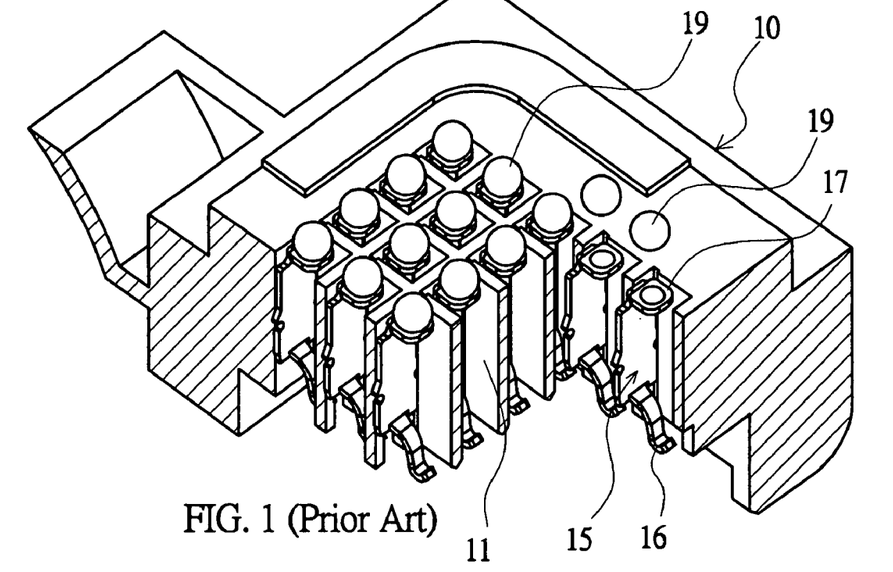
FIG. 1 is a pictorial view showing a conventional electrical connector with the mounted solder balls.

Referring to FIG. 1, a conventional electrical connector with a solder ball mounting structure includes a base 10 and a plurality of terminals 15. The base 10 has a plurality of terminal slots 11 and the terminals 15 are respectively disposed in the terminal slots 11. One end of the terminal is formed with a contact 16, and the other end of the terminal is formed with a horizontal connecting sheet 17. The connecting sheet 17 has a concave middle portion and a cup-shape, and is bonded to a solder ball 19.

The above-mentioned structure has the following drawbacks.

1. It is time-consuming to apply the flux to the connecting sheets 17 and align the solder balls 19 with the connecting sheets 17 using a jig.

2. The bottom end of the solder ball 19 is welded to the horizontal connecting sheet 17 and the welding point is located at the bottom. The base 10 cannot have a circumferential wall around the solder ball 19 to position the solder ball because the circumferential wall may interrupt the heat and is disadvantageous to the welding. So, the solder ball only can be placed on the concave, cup-shaped middle portion of the connecting sheet 17. However, the method for positioning the solder ball is not stable. A poor effect for positioning the solder ball on the connecting sheet 17 is more obvious when the solder ball connection points of the connector are denser such that the solder ball and the cup-shape of the connecting sheet are smaller.

3. There is no blocking structure around each solder ball, so the adjacent solder balls may contact each other to cause the short-circuit condition when the gap between the solder balls is relatively small.

SUMMARY OF THE INVENTION

It is therefore an object of the invention to provide an electrical connector with a solder ball locking structure and a method for manufacturing the same, wherein the connecting sheet of the terminal and the solder ball may be firmly combined without the welding process.

Another object of the invention is to provide an electrical connector with a solder ball locking structure and a method for manufacturing the same, wherein the solder ball may be placed into, surrounded by and firmly positioned by the solder ball slot in order to prevent the adjacent solder balls from being short-circuited.

To achieve the above-identified objects, the invention provides an electrical connector, which includes a base, a plurality of solder balls, and a plurality of terminals. The base has a plurality of terminal slots spaced apart from one another, a plurality of solder ball slots spaced apart from one another, and a plurality of channels respectively communicating the terminal slots with the solder ball slots. The solder ball slots are located under the corresponding terminal slots, respectively. The solder balls are respectively disposed in the solder ball slots. Each of the solder balls has a bottom end projecting over a bottom of the base. The terminals are respectively disposed in the plurality of terminal slots. Each of the terminals has a contact extending toward a top of the terminal slot and at least one connecting sheet extending toward a bottom of the terminal slot. The at least one connecting sheet extends to the solder ball slot through the channel and intrudes into the solder ball to form a locking structure, which prevents the solder ball from falling out of the solder ball slot.

The invention also provides a method for manufacturing an electrical connector. The method includes the steps of: providing a base, wherein the base has a plurality of terminal slots spaced apart from one another, a plurality of solder ball slots spaced apart from one another, and a plurality of channels respectively communicating the terminal slots with the solder ball slots, wherein the solder ball slots are located under the corresponding terminal slots, respectively; disposing a plurality of terminals in the plurality of terminal slots, respectively, wherein each of the terminals has a contact extending toward a top of the corresponding terminal slot and at least one connecting sheet extending toward a bottom of the corresponding terminal slot, and the at least one connecting sheet extends to the solder ball slot through the channel; disposing a plurality of solder balls in the solder ball slots, respectively, wherein a bottom end of each of the solder balls projects over a bottom of the base; and using a jig to press the at least one connecting sheet of the terminal so as to make the at least one connecting sheet intrude into the solder ball to form a locking structure, which prevents the solder ball from falling out of the solder ball slot.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 2:
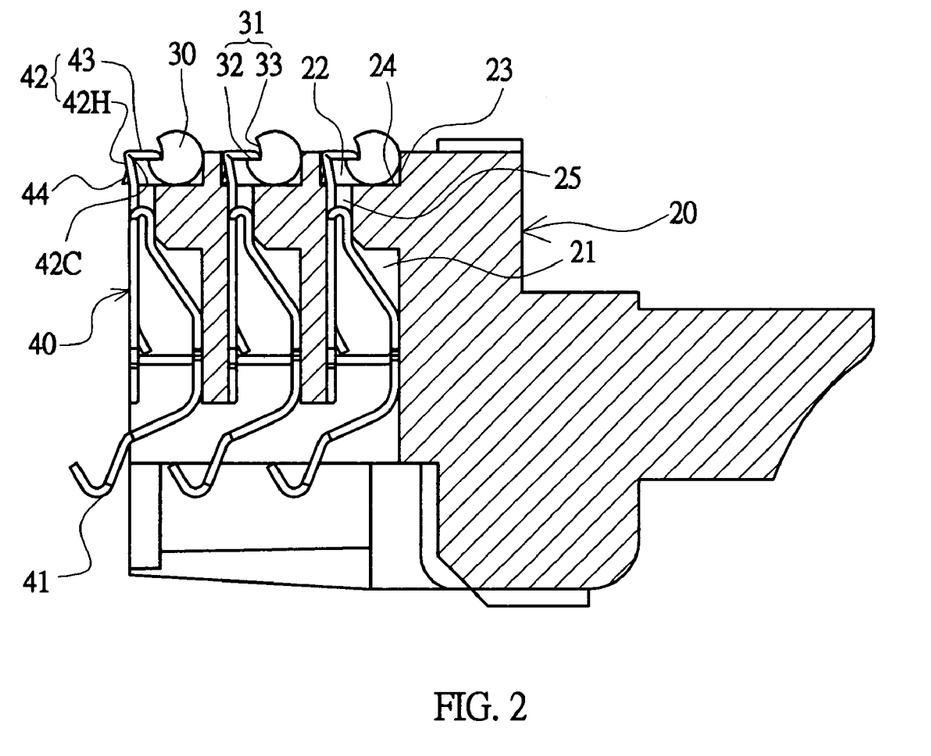
FIG. 2 is a cross-sectional view showing an electrical connector according to a first embodiment of the invention.
Figure 3:
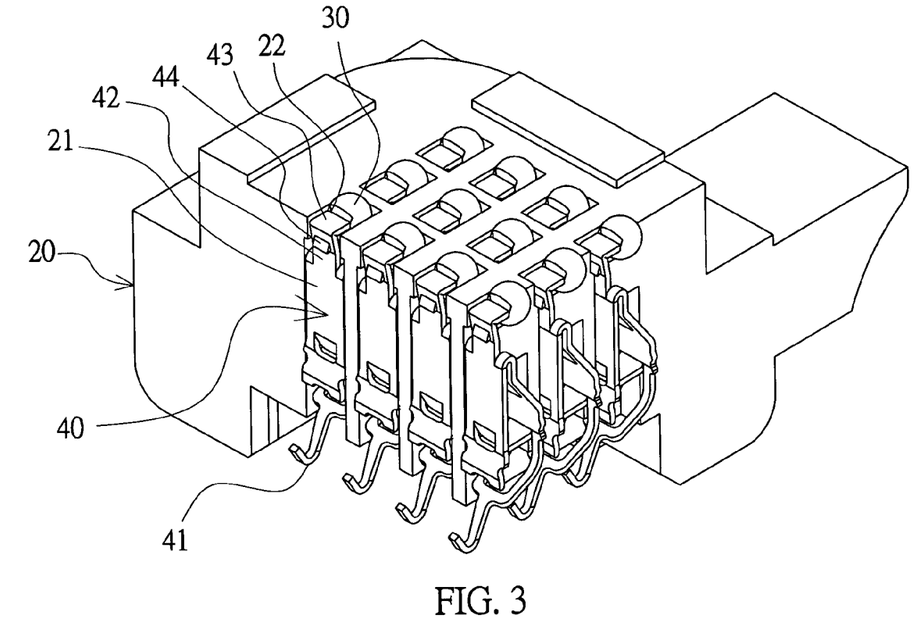
FIG. 3 is a pictorial view showing the electrical connector according to the first embodiment of the invention.

Referring to FIGS. 2 and 3, an electrical connector of the invention includes a base 20, a plurality of solder balls 30 and a plurality of terminals 40.

The base 20 has terminal slots 21 spaced apart from one another, solder ball slots 22 spaced apart from one another, and channels 25 formed at a side to respectively communicate the terminal slots 21 with the solder ball slots 22. Each solder ball slot 22 is located under one corresponding terminal slot 21. Each solder ball slot 22 has a circumferential wall 23 and a bottom surface 24 spaced from the terminal slot 21.

Each solder ball 30 is disposed in the solder ball slot 22 and against the circumferential wall 23. Each solder ball 30 has a bottom end projecting over the bottom of the base 20.

The terminals 40 are disposed in the terminal slots 21, respectively. Each terminal 40 has a contact 41 extending toward a top of the terminal slot 21, and at least one connecting sheet 42 extending toward a bottom of the terminal slot 21. The connecting sheet 42 extends to the solder ball slot 22 through the channel 25 and intrudes into the solder ball 30 to form a locking structure. The solder ball 30 is formed with a recess 31, which has a first portion 32 for accommodating the connecting sheet 42 and a second portion 33 left empty. The locking structure is a horizontal pressing plate 43 and presses against a side of the solder ball 30 so as to prevent the solder ball 30 from falling out of the solder ball slot 22. In addition, the connecting sheet 42 has a stopper 44 against the bottom surface 24 of the solder ball slot. The connecting sheet 42 of the terminal 40 has a first plate 42H, which is accommodated in the solder ball slot 22, and the horizontal pressing plate (second plate) 43, which presses against the solder ball 30 and is connected to the first plate 42H so that a crease 42C is formed between the first plate 42H and the second plate 43.

A method for manufacturing the above-mentioned structure will be described in the following.

Figure 4:
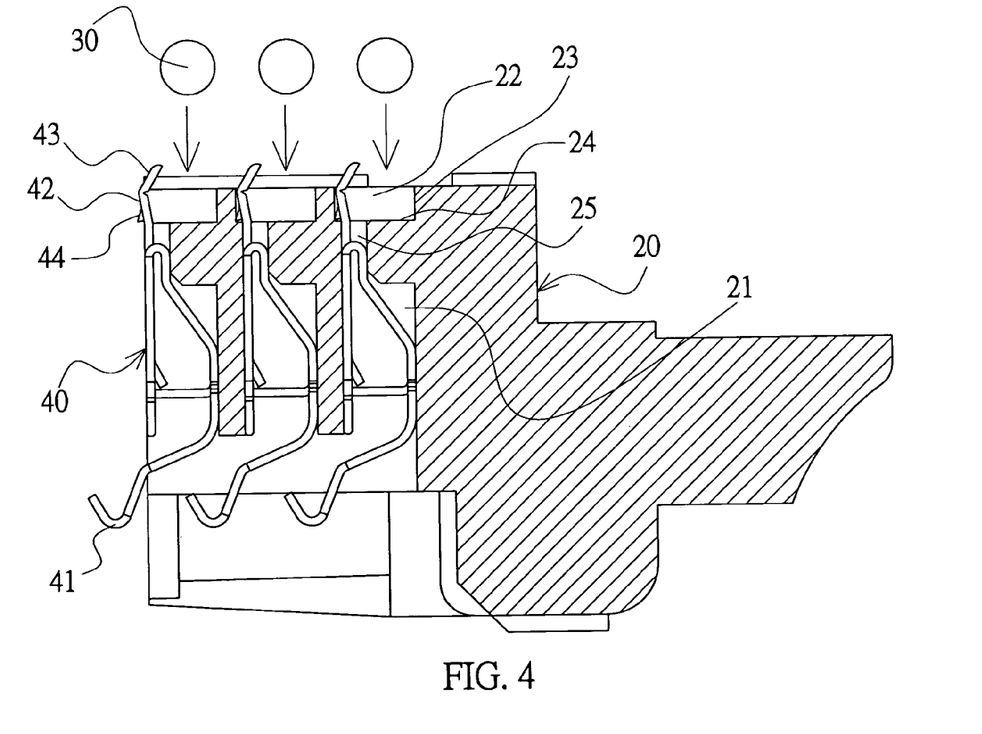
FIG. 4 is a schematic illustration showing a method for manufacturing the electrical connector according to the first embodiment of the invention.

As shown in FIG. 4, a base 20 is provided, wherein the base 20 has terminal slots 21 spaced apart from one another, solder ball slots 22 spaced apart from one another, and channels 25 formed at a side of the terminal slots 21 and solder ball slots 22 to respectively communicate the terminal slots 21 with the solder ball slots 22. Each solder ball slot 22 is located under one corresponding terminal slot 21. Each solder ball slot 22 has a circumferential wall 23 and a bottom surface 24 spaced from the terminal slot 21.

Then, a plurality of terminals 40 is provided in the plurality of terminal slots 21, where each terminal 40 has a contact 41 extending toward a top of the terminal slot 21, and a connecting sheet 42 extending toward a bottom of the terminal slot 21. The connecting sheet 42 extends to the solder ball slot 22 through the channel 25. A tail end of the connecting sheet 42 is formed with a slanting pressing plate 43. In addition, the connecting sheet 42 has a stopper 44 against the bottom surface 24 of the solder ball slot 22.

Figure 5:
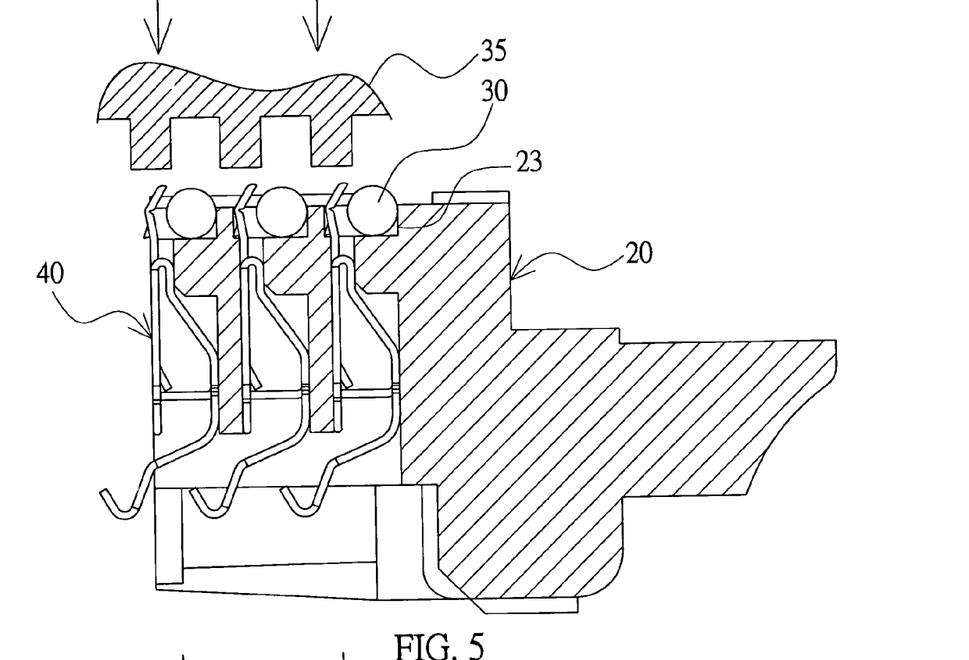
FIG. 5 is a schematic illustration showing the method for manufacturing the electrical connector according to the first embodiment of the invention.

As shown in FIG. 5, a plurality of solder balls 30 is provided. Each solder ball 30 is disposed in the corresponding solder ball slot 22 and against the circumferential wall 23, and the bottom end of each solder ball 30 projects over the bottom of the base 20.

Figure 6:
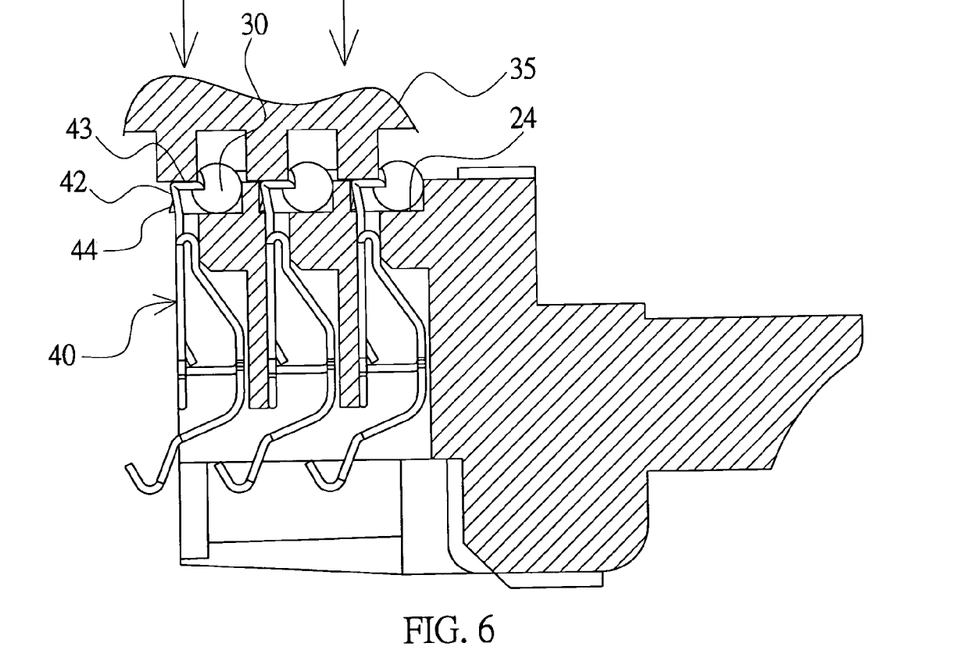
FIG. 6 is a schematic illustration showing the method for manufacturing the electrical connector according to the first embodiment of the invention.

As shown in FIG. 6, a jig 35 is used to press the pressing plate 43 of the tail end of the connecting sheet 42 of each terminal 40 to make the pressing plate 43 into a horizontal state and intrude into a side of the solder ball 30 to form a locking structure, which can prevent the solder ball 30 from falling out of the solder ball slot 22. During the pressing process, the terminal 40 is free from being shifted up and down and the connecting sheet 42 can completely withstand the pressing force because the connecting sheet 42 of the terminal 40 may resist the bottom surface 24 of the solder ball slot 22 through the stopper 44.

Figure 7:
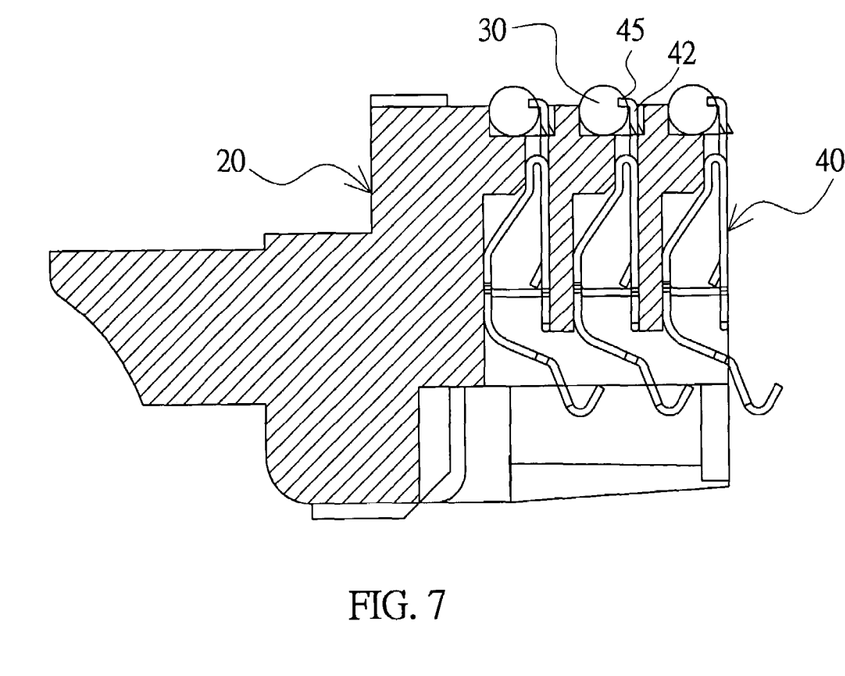
FIG. 7 is a cross-sectional view showing an electrical connector according to a second embodiment of the invention.
Figure 8:
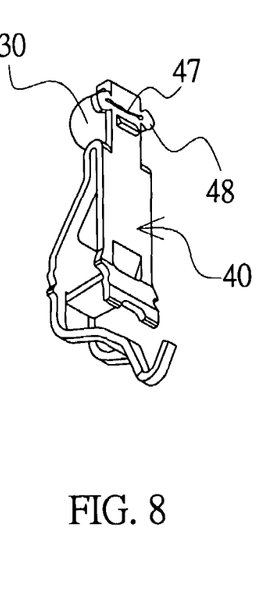
FIG. 8 is a pictorial view showing a terminal and a solder ball are combined together in the second embodiment of the invention.

As shown in FIGS. 7 and 8, the second embodiment of the invention is almost the same as the first embodiment, and the difference therebetween is that the locking structure of the connecting sheet 42 of the terminal 40 is a protrudent sheet 45 intruding into the solder ball 30, the connecting sheet 42 is formed with a punched hole 47, and the punched hole 47 is formed with projections 48 at two sides.

Figure 9:
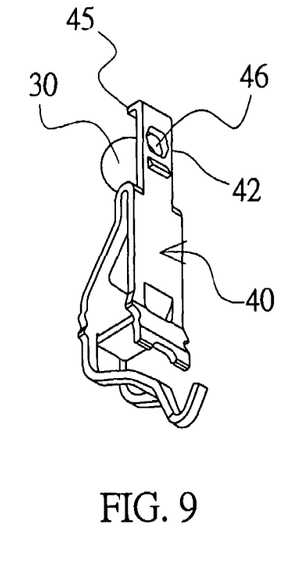
FIG. 9 is a pictorial view showing the terminal and the solder ball are combined together in the second embodiment of the invention.
Figure 10:
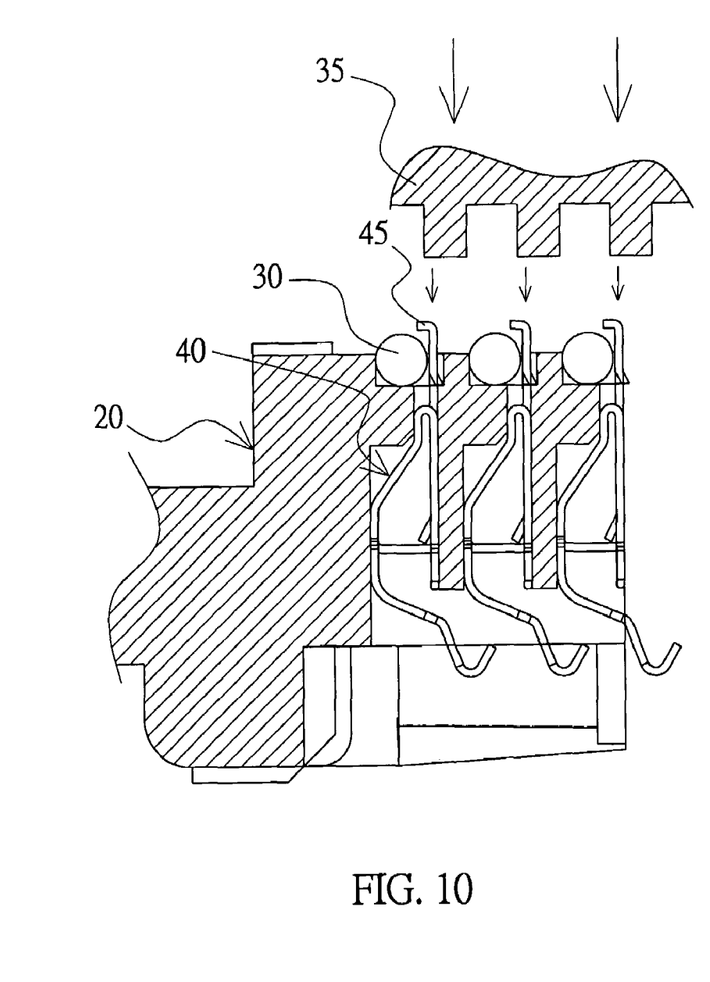
FIG. 10 is a schematic illustration showing a method for manufacturing the electrical connector according to the second embodiment of the invention.
Figure 11:
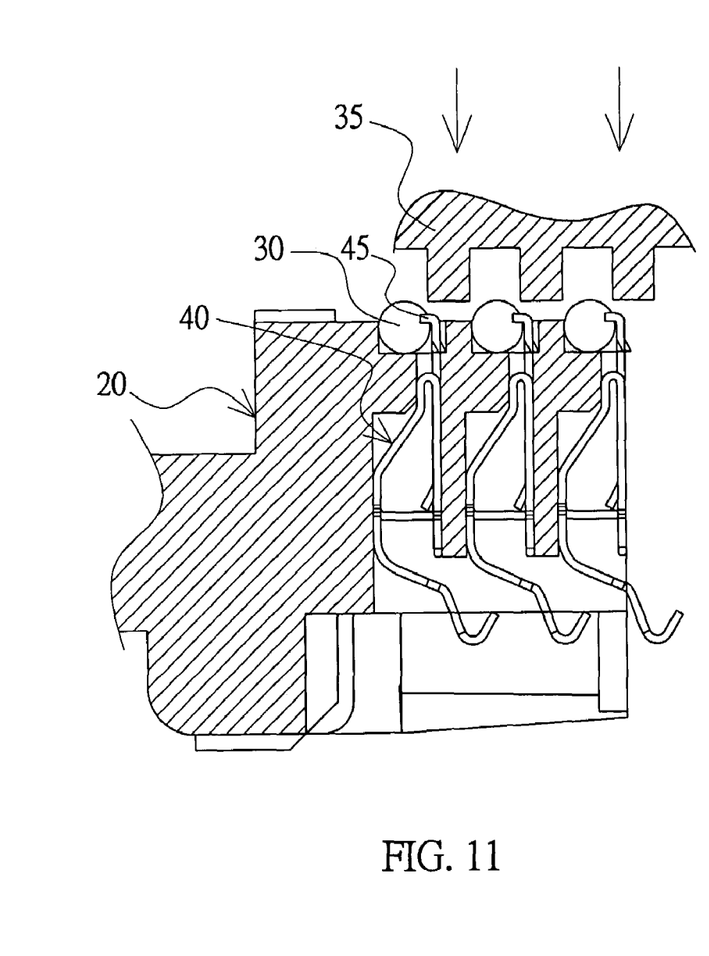
FIG. 11 is a schematic illustration showing the method for manufacturing the electrical connector according to the second embodiment of the invention.

As shown in FIGS. 9 to 11, a method of the second embodiment is different from that of the first embodiment in that the distal end of the connecting sheet 42 of each terminal 40 is bent into a protrudent sheet 45 projecting toward the solder ball 30, and the connecting sheet 42 is formed with an open hole 46. When a jig 35 is provided to press the connecting sheet 42, the open hole 46 is punched into a punched hole 47, and the protrudent sheet 45 intrudes into a side of the solder ball 30 to form a locking structure for locking the solder ball 30. Two sides of the punched hole 47 are formed with projections 48.

Figure 12:
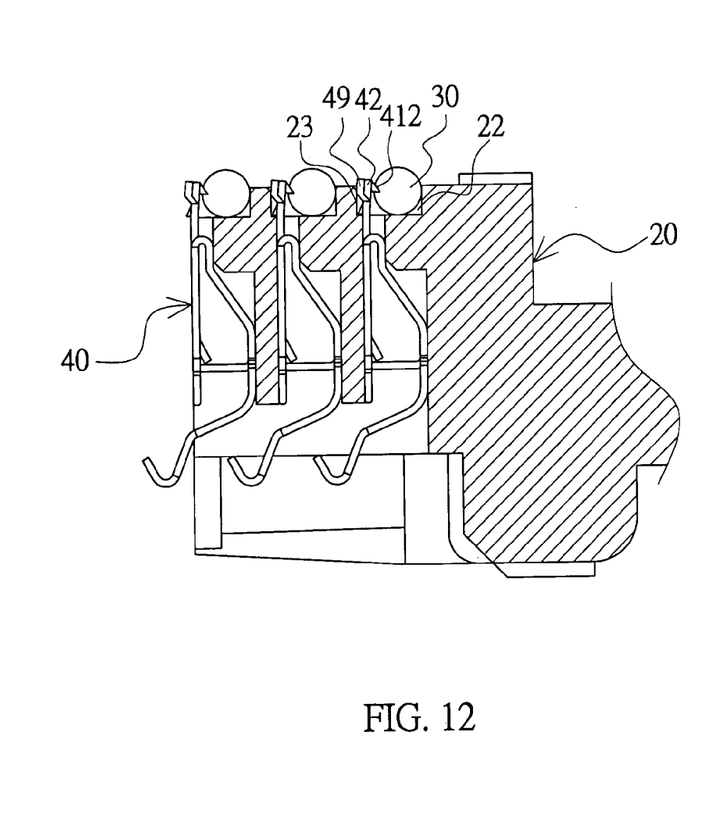
FIG. 12 is a cross-sectional view showing an electrical connector according to a third embodiment of the invention.

As shown in FIG. 12, the third embodiment of the invention is almost the same as the first embodiment except for the difference that the locking structure of the connecting sheet 42 of the terminal 40 is a barb 412 intruding into the solder ball, and an insertion sheet 49 is inserted between the circumferential wall 23 of the solder ball slot 22 and the connecting sheet 42.

Figure 13:
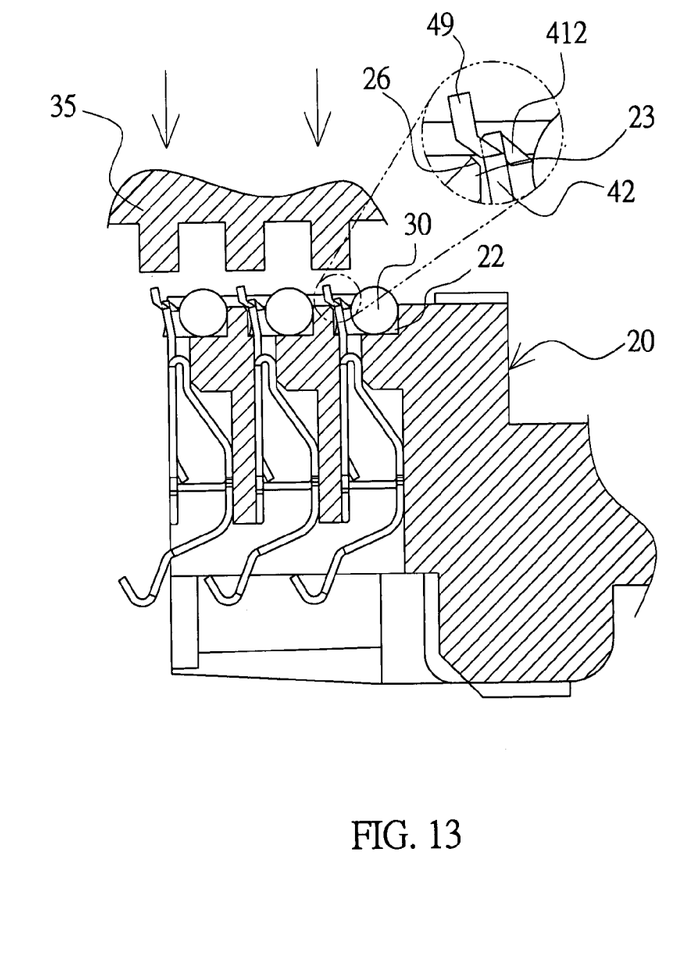
FIG. 13 is a schematic illustration showing a method for manufacturing the electrical connector according to the third embodiment of the invention.
Figure 14:
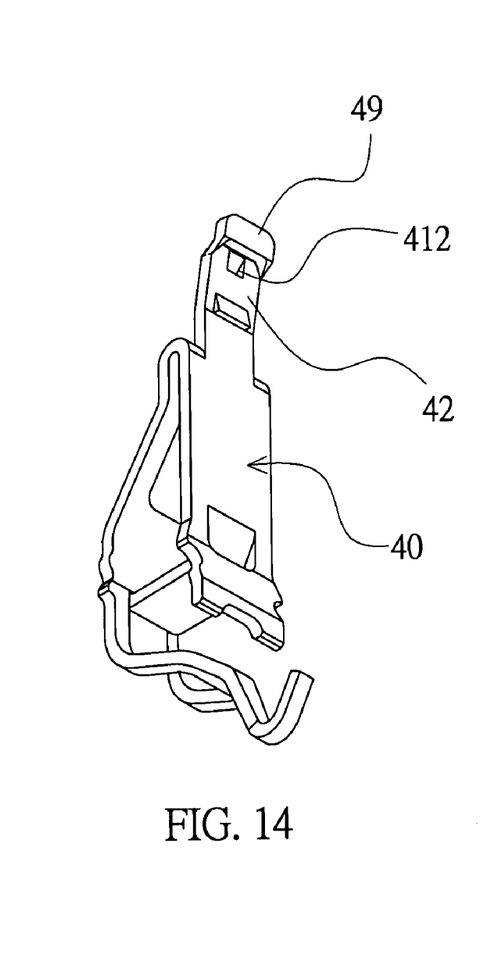
FIG. 14 is a pictorial view showing a terminal during the manufacturing process according to the third embodiment of the invention.
Figure 15:
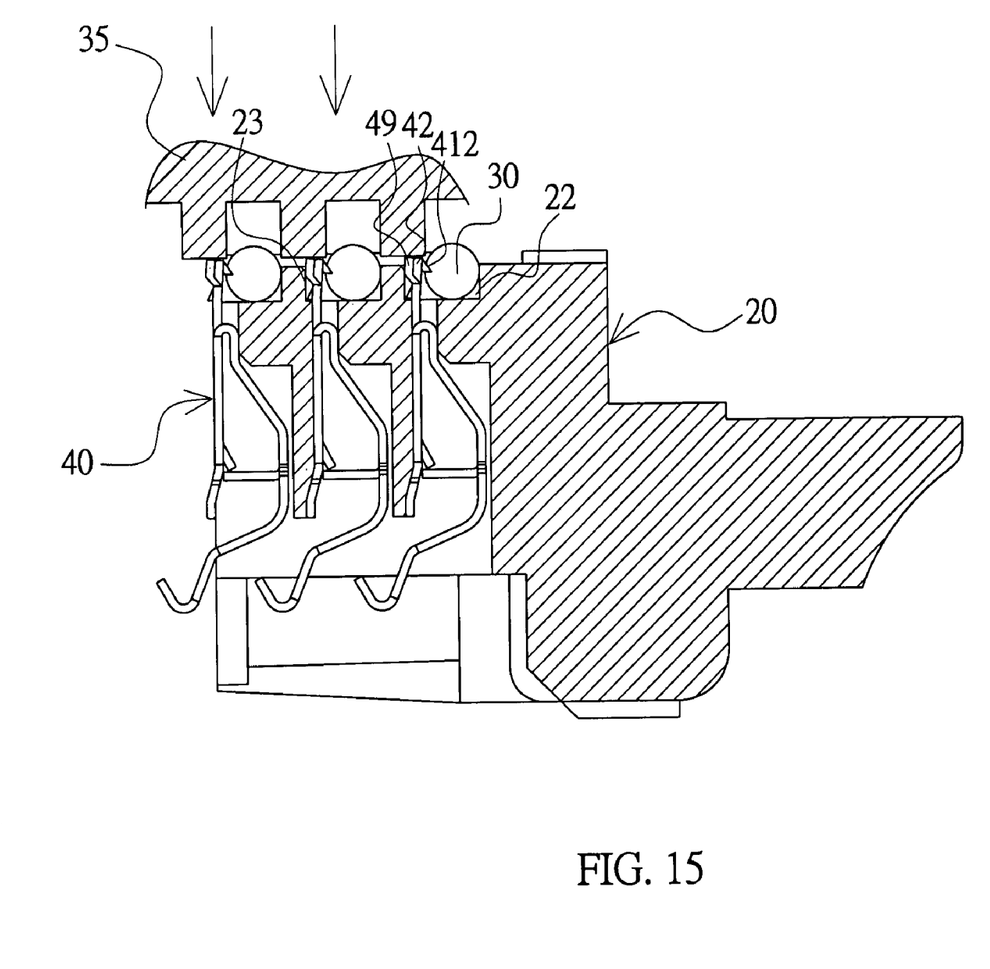
FIG. 15 is a schematic illustration showing a method for manufacturing the electrical connector according to the third embodiment of the invention.

As shown in FIGS. 13 to 15, the difference between the methods of the third and first embodiments is that a guiding bevel edge 26 is formed at the circumferential wall of the solder ball slot 22 of the base 20. The connecting sheet 42 of each terminal 40 is formed with a barb 412 projecting toward the solder ball, and a tail end of the connecting sheet 42 is formed with a pre-broken insertion sheet 49. When a jig 35 is provided to press the insertion sheet 49 of the tail end of the connecting sheet 42, the insertion sheet 49 may be broken and inserted between the circumferential wall 23 of the solder ball slot 22 and the connecting sheet 42 through the guiding bevel edge 26. Then, the insertion sheet 49 forces the barb 412 of the connecting sheet 42 to intrude into the solder ball and to form the locking structure.

Figure 16:
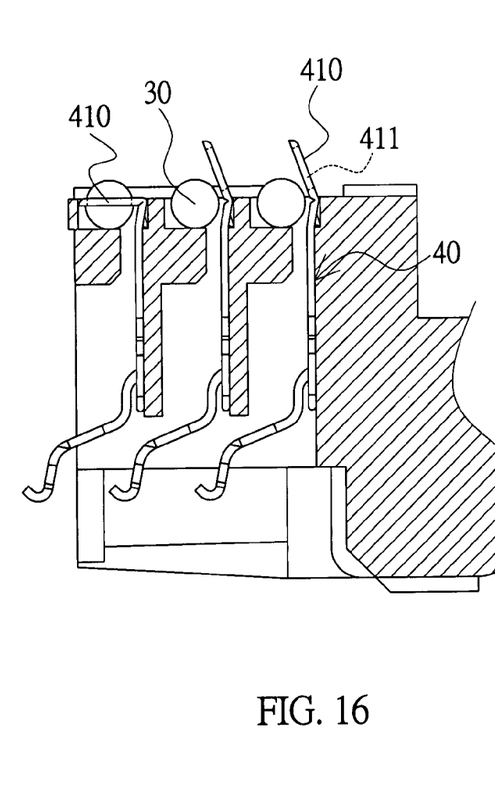
FIG. 16 is a schematically cross-sectional view showing an electrical connector according to a fourth embodiment of the invention.
Figure 17:
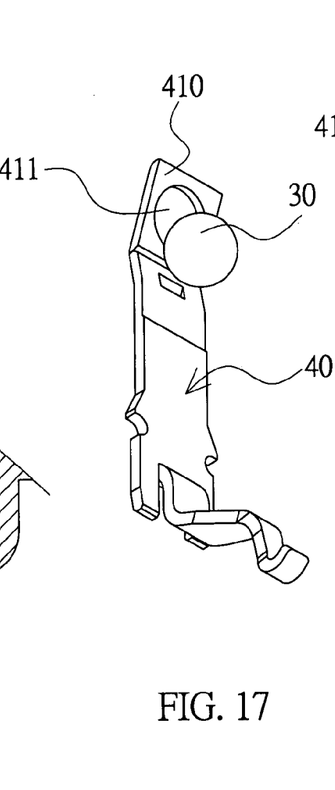
FIG. 17 is a pictorial view showing a terminal and a solder ball during the manufacturing process of the fourth embodiment of the invention.

As shown in FIGS. 16 and 17, the fourth embodiment of the invention is almost the same as the first embodiment except for the difference that the locking structure of the connecting sheet 42 of the terminal 40 is a horizontal pressing plate 410 pressing against the solder ball. The pressing plate 410 is formed with an open hole 411 smaller than the solder ball 30 such that the bottom end of the solder ball 30 projects over the open hole 411. The difference between the methods of this embodiment and the first embodiment is that the tail end of the connecting sheet 42 of each terminal 40 is formed with a slanting pressing plate 410, and the pressing plate 410 is formed with an open hole 411 slightly smaller than the solder ball 30. A jig 35 is provided to press the pressing plate 410 into a horizontal state to press against the solder ball 30 and to form a locking structure. The bottom end of the solder ball 30 may project over the open hole 411.

Figure 18:
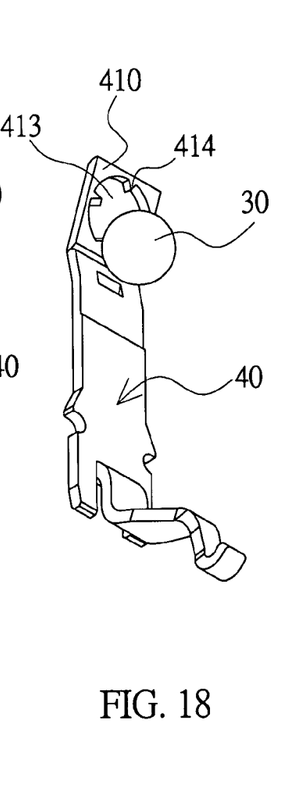
FIG. 18 is a pictorial view showing a terminal and a solder ball during the manufacturing process of a fifth embodiment of the invention.
Figure 19:
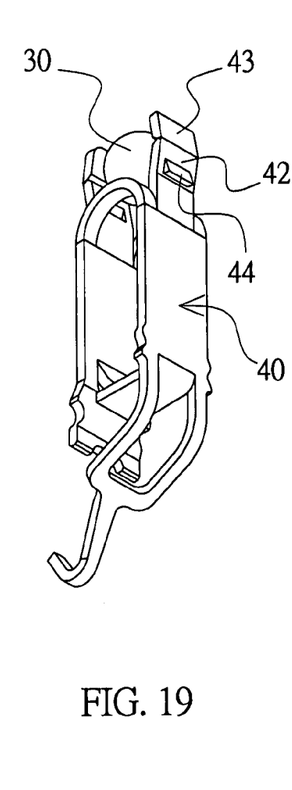
FIG. 19 is a pictorial view showing a terminal and a solder ball during the manufacturing process of a sixth embodiment of the invention.
Figure 20:
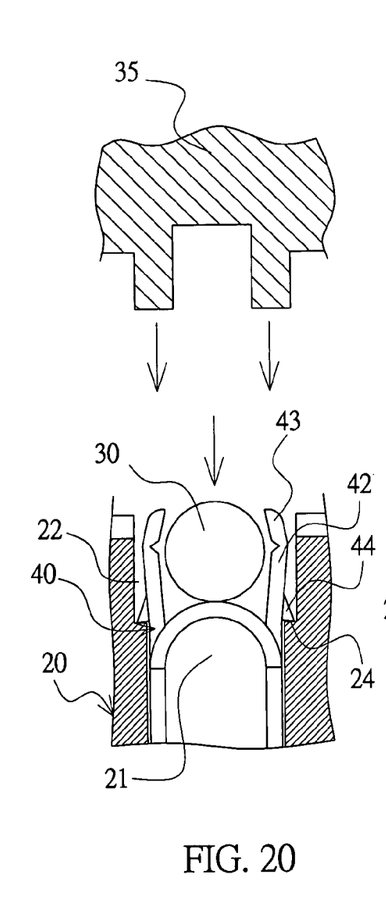
FIG. 20 is a schematic illustration showing a method for manufacturing an electrical connector according to the sixth embodiment of the invention.
Figure 21:
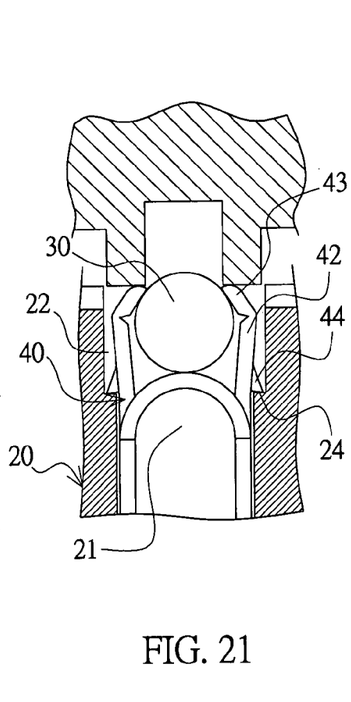
FIG. 21 is a schematic illustration showing the method for manufacturing the electrical connector according to the sixth embodiment of the invention.
Figure 22:
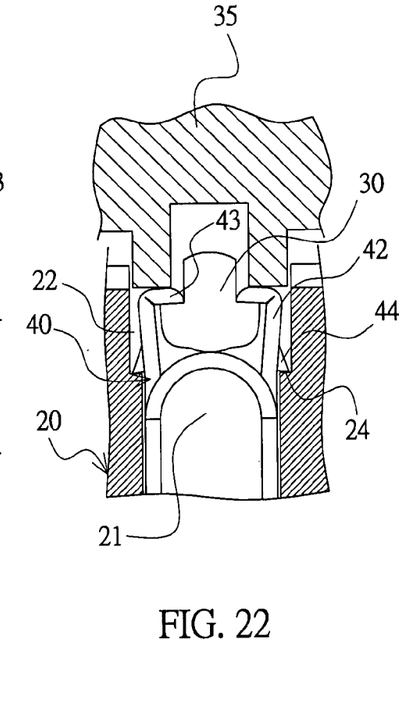
FIG. 22 is a schematic illustration showing the method for manufacturing the electrical connector according to the sixth embodiment of the invention.

As shown in FIG. 18, the fifth embodiment of the invention is almost the same as the fourth embodiment except for the difference that the pressing plate 410 is formed with an open hole 413 slightly larger than the solder ball 30. A circumferential edge of the open hole is formed with a plurality of symmetrical projections 414. When a jig is provided to press the pressing plate 410 into a horizontal state to press against the solder ball 30, the plurality of symmetrical projections 414 lock into the solder balls.

As shown in FIGS. 19 to 22, the sixth embodiment of the invention is almost the same as the first embodiment except for the difference that the terminal 40 is formed with two symmetrical connecting sheets 42. The method includes the following steps.

First, a base 20 is provided. The base 20 has a plurality of terminal slots 21 spaced apart from one another and a plurality of solder ball slots 22 spaced apart from one another. Each solder ball slot 22 is located under the corresponding terminal slot 21. The solder ball slot 22 communicates with the terminal slot 21, and the solder ball slot 22 only has a bottom surface 24 on the circumferential edge.

Then, a plurality of terminals 40 is disposed in the plurality of terminal slots 21. Each terminal 40 has a contact extending toward the top of the terminal slot 21 and two symmetrical connecting sheets 42 extending toward the bottom of the terminal slot 21. The two connecting sheets 42 extend to the solder ball slot 22, and a tail end of the connecting sheet 42 is formed with a slanting pressing plate 43. In addition, the connecting sheet 42 has a stopper 44 against the bottom surface 24 of the solder ball slot 22.

Next, a plurality of solder balls 30 is disposed in the solder ball slots 22, wherein the bottom end of each solder ball 30 projects over the bottom of the base 20.

Then, a jig 35 is used to press the pressing plates 43 of the tail ends of the two connecting sheets 42 of each terminal 40 into a horizontal state to intrude into two sides of the solder ball 30 to form a locking structure, which can prevent the solder ball 30 from falling out of the solder ball slot 22.

Figure 23:
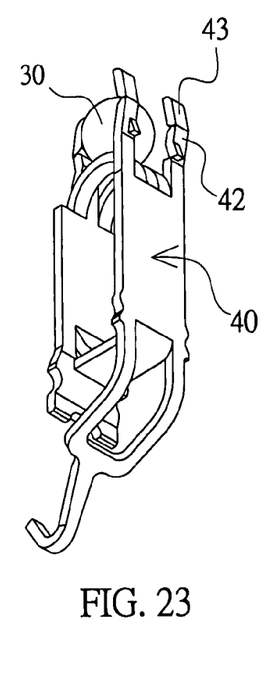
FIG. 23 is a pictorial view showing a terminal and a solder ball during the manufacturing process of a seventh embodiment of the invention.

As shown in FIG. 23, the seventh embodiment of the invention is almost the same as the sixth embodiment except for the difference that the terminal 40 has three connecting sheets 42. The pressing plate 43 of each connecting sheet is forced into a horizontal state to intrude into the solder ball 30 to form a locking structure.

Figure 24:
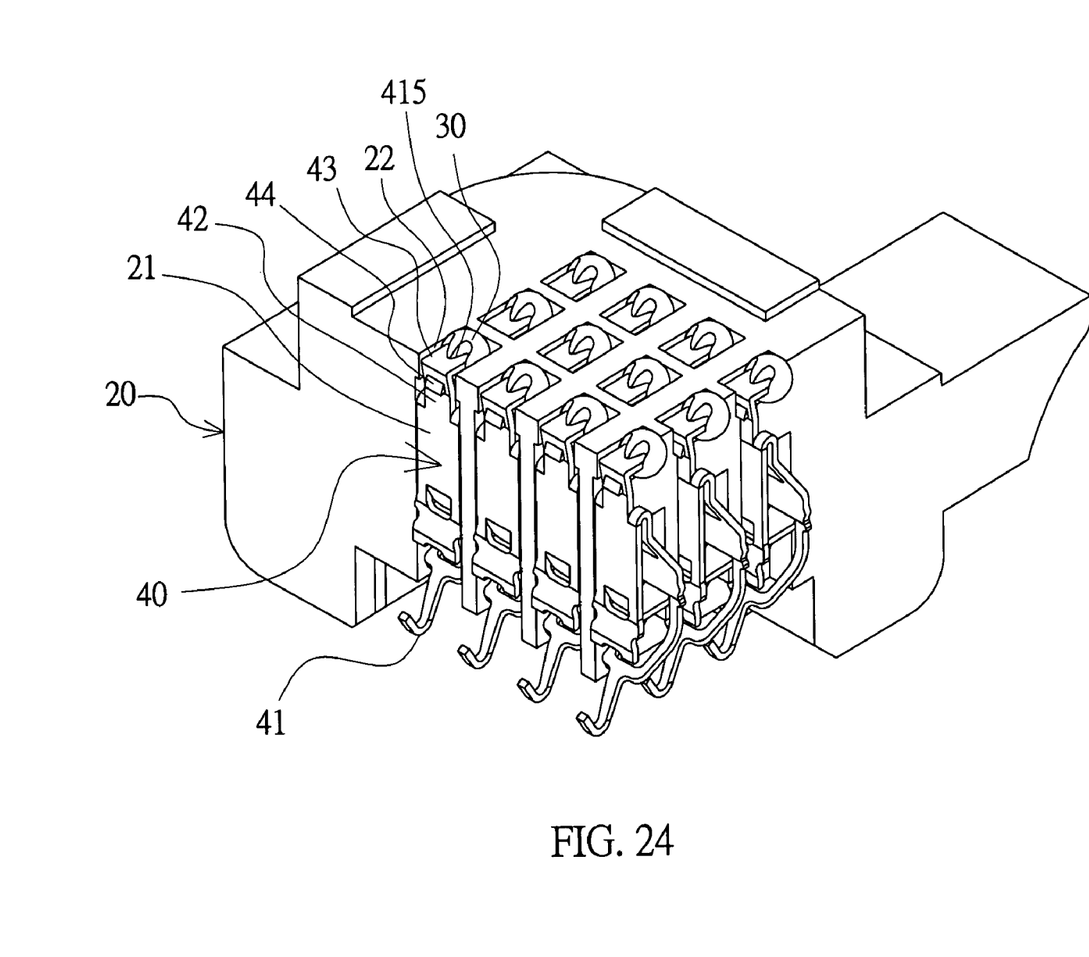
FIG. 24 is a pictorial view showing an electrical connector according to an eighth embodiment of the invention.
Figure 25:
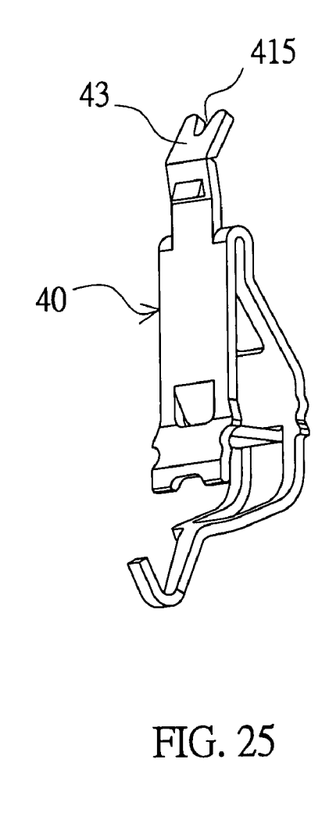
FIG. 25 is a pictorial view showing a terminal during the manufacturing process of the eighth embodiment of the invention.

As shown in FIGS. 24 and 25, the eighth embodiment of the invention is almost the same as the first embodiment except for the difference that the pressing plate 43 of the terminal 40 is formed with a notch 415 pressing against the solder ball 30. Therefore, the jig may force the pressing plate 43 to intrude into the solder ball 30 with a smaller force, so as to facilitate the manufacturing process.

Figure 26:
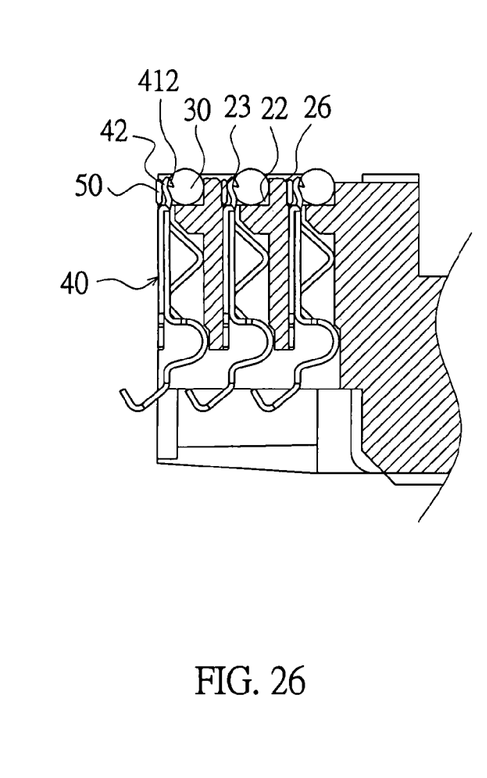
FIG. 26 is a cross-sectional view showing an electrical connector according to a ninth embodiment of the invention.
Figure 27:
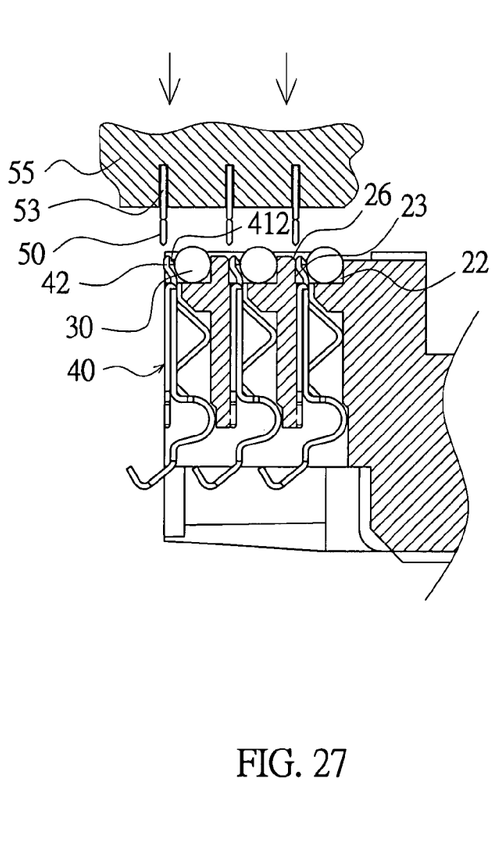
FIG. 27 is a schematic illustration showing a method for manufacturing the electrical connector according to the ninth embodiment of the invention.
Figure 28:
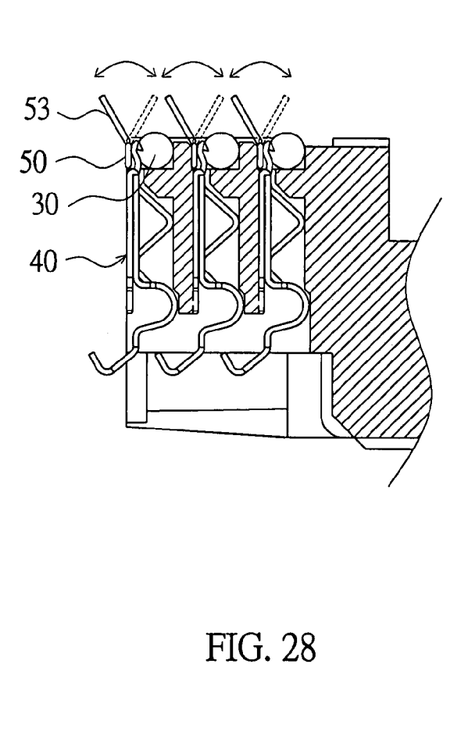
FIG. 28 is a schematic illustration showing the method for manufacturing the electrical connector according to the ninth embodiment of the invention.

As shown in FIG. 26, the solder ball locking structure of the ninth embodiment of the invention is almost the same as the third embodiment, but the manufacturing methods are different from each other. As shown in FIGS. 27 and 28, the difference between the manufacturing methods of the ninth and third embodiments is that the terminal 40 is not connected to a pre-broken insertion sheet. Instead, a plurality of insertion sheets 50 is additionally provided. The insertion sheets 50 are connected to a material tape 53 to form a row. Then, multiple rows of insertion sheets are arranged on a jig 55. Next, the jig 55 is pressed to press the rows of insertion sheets 50 between the circumferential wall 23 of the solder ball slot 22 and the connecting sheet 42 along the guiding bevel edge 26, such that the barb 412 of the connecting sheet 42 is forced to intrude into the solder ball 30 to form a locking structure, which prevents the solder ball 30 from falling out of the solder ball slot. Finally, the material tape 53 is broken, as shown in FIG. 28.

The invention has the following advantages.

1. Since the locking structure for locking the solder ball in this invention is formed by mechanical machining, it is possible to eliminate the processes of applying the flux, precisely aligning the solder ball, and hot working. So, the manufacturing processes may be simplified.

2. The solder ball 30 can be firmly positioned in the solder ball slot 22 and combined with the connecting sheet 42 of the terminal with the aid of the solder ball slot 22 in conjunction with a locking structure.

3. Two adjacent solder balls 30 are spaced apart by a solder ball slot 22, so the short-circuited condition of the solder balls may be eliminated.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electrical connector, comprising:
a base having a plurality of terminal slots spaced apart from one another, a plurality of solder ball slots spaced apart from one another, and a plurality of channels respectively communicating the terminal slots with the solder ball slots, wherein the solder ball slots are located under the corresponding terminal slots, respectively;
a plurality of solder balls respectively disposed in the solder ball slots, wherein each of the solder balls has a bottom end projecting over a bottom of the base; and
a plurality of terminals respectively disposed in the plurality of terminal slots, wherein each of the terminals has a contact extending toward a top of the terminal slot and at least one connecting sheet extending toward a bottom of the terminal slot, the at least one connecting sheet extends to the solder ball slot through the channel and intrudes into the solder ball to form a locking structure, which prevents the solder ball from falling out of the solder ball slot, the solder ball is formed with a recess, which has a first portion for accommodating the at least one connecting sheet and a second portion left empty, and the at least one connecting sheet of the terminal has a first plate, which is accommodated in the solder ball slot, and a second plate, which presses against the solder ball and is connected to the first plate so that a crease is formed between the first plate and the second plate.

2. The electrical connector according to claim 1, wherein each of the solder ball slots has a bottom surface, and the at least one connecting sheet of the terminal is formed with a stopper against the bottom surface of the solder ball slot.

3. The electrical connector according to claim 1, wherein the second plate of the at least one connecting sheet of the terminal is a horizontal pressing plate pressing against a side of the solder ball.

4. The electrical connector according to claim 1, wherein the second plate of the at least one connecting sheet of the terminal is a horizontal pressing plate pressing against the solder ball, and the horizontal pressing plate is formed with an open hole smaller than the solder ball such that the bottom end of the solder ball projects over the open hole.

5. The electrical connector according to claim 1, wherein the second plate of the at least one connecting sheet of the terminal is a horizontal pressing plate pressing against the solder ball, the horizontal pressing plate is formed with an open hole larger than the solder ball, and a circumferential edge of the open hole is formed with a plurality of symmetrical projections locked into the solder balls.

6. The electrical connector according to claim 1, wherein the terminal is formed with two connecting sheets extending toward the bottom of the terminal slot.

7. The electrical connector according to claim 1, wherein the terminal is formed with three connecting sheets extending toward the bottom of the terminal slot.

8. The electrical connector according to claim 1, wherein an end of the second plate is formed with a notch pressing against the solder ball.

9. An electrical connector, comprising:
a base having a plurality of terminal slots spaced apart from one another, a plurality of solder ball slots spaced apart from one another, and a plurality of channels respectively communicating the terminal slots with the solder ball slots, wherein the solder ball slots are located under the corresponding terminal slots, respectively;
a plurality of solder balls respectively disposed in the solder ball slots, wherein each of the solder balls has a bottom end projecting over a bottom of the base; and
a plurality of terminals respectively disposed in the plurality of terminal slots, wherein each of the terminals has a contact extending toward a top of the terminal slot and at least one connecting sheet extending toward a bottom of the terminal slot, the at least one connecting sheet extends to the solder ball slot through the channel and intrudes into the solder ball to form a locking structure, which prevents the solder ball from falling out of the solder ball slot, the solder ball is formed with a recess, which has a first portion for accommodating the at least one connecting sheet and a second portion left empty, the locking structure of the at least one connecting sheet of the terminal is a protrudent sheet intruding into the solder ball, the at least one connecting sheet is formed with a punched hole, and projections are formed at two sides of the punched hole.

10. An electrical connector, comprising:
a base having a plurality of terminal slots spaced apart from one another, a plurality of solder ball slots spaced apart from one another, and a plurality of channels respectively communicating the terminal slots with the solder ball slots, wherein the solder ball slots are located under the corresponding terminal slots, respectively;
a plurality of solder balls respectively disposed in the solder ball slots, wherein each of the solder balls has a bottom end projecting over a bottom of the base; and
a plurality of terminals respectively disposed in the plurality of terminal slots, wherein each of the terminals has a contact extending toward a top of the terminal slot and at least one connecting sheet extending toward a bottom of the terminal slot, the at least one connecting sheet extends to the solder ball slot through the channel and intrudes into the solder ball to form a locking structure, which prevents the solder ball from falling out of the solder ball slot, the solder ball is formed with a recess, which has a first portion for accommodating the at least one connecting sheet and a second portion left empty, the locking structure of the at least one connecting sheet of the terminal is a barb intruding into the solder ball, and an insertion sheet is inserted between a circumferential wall of the solder ball slot and the at least one connecting sheet.

* * * * *